(12) United States Patent
Wang

(10) Patent No.: US 10,804,896 B2
(45) Date of Patent: Oct. 13, 2020

(54) PROXIMITY MAGNETIC INDUCTION SWITCH CONTROL CHIP AND ITS CONTROL METHOD

(71) Applicant: SHENZHEN MOJAY SEMICONDUCTOR LIMITED, Shenzhen, Guangdong (CN)

(72) Inventor: Jian Wang, Guangdong (CN)

(73) Assignee: SHENZHEN MOJAY SEMICONDUCTOR LIMITED, Shenzhen (CN)

( * ) Notice: Subject to any disclaimer, the term of this patent is extended or adjusted under 35 U.S.C. 154(b) by 65 days.

(21) Appl. No.: 16/334,200

(22) PCT Filed: Mar. 6, 2017

(86) PCT No.: PCT/CN2017/075776
§ 371 (c)(1),
(2) Date: Mar. 18, 2019

(87) PCT Pub. No.: WO2018/161222
PCT Pub. Date: Sep. 13, 2018

(65) Prior Publication Data
US 2019/0222212 A1    Jul. 18, 2019

(51) Int. Cl.
H03K 17/95 (2006.01)
H01L 27/22 (2006.01)

(52) U.S. Cl.
CPC ......... *H03K 17/9517* (2013.01); *H01L 27/22* (2013.01)

(58) Field of Classification Search
CPC .............................. H03K 17/9517; H01L 27/22
(Continued)

(56) References Cited

U.S. PATENT DOCUMENTS 4,705,964 A * 11/1987 Higgs ..................... H01L 27/22
257/E27.005
4,908,527 A * 3/1990 Van Antwerp .......... G05F 3/225
257/423
(Continued)

FOREIGN PATENT DOCUMENTS

CN      205491328      8/2016
CN      205584164      9/2016
CN      205584168      9/2016

OTHER PUBLICATIONS

International Search Report, issued in International Application No. PCT/CN2017/075776, dated Dec. 14, 2017, 5 pages.

*Primary Examiner* — Ryan Jager
(74) *Attorney, Agent, or Firm* — Hamre, Schumann, Mueller & Larson, P.C.

(57) ABSTRACT

The invention relates to a proximity magnetic induction switch control chip and a control method thereof. A proximity magnetic induction switch control chip includes a voltage regulator module, a control module, an output type detection module, a first controllable switch and a second controllable switch. An output type detection module detects proximity magnets. An output type detection module detects a load connected between a voltage input and a signal output of a proximity magnetic induction switch control chip or a load connected between a signal output and a ground terminal. The detection result is transmitted to the control module. The control module controls the first controllable switch or the second controllable switch to actuate the load according to the detection result.

9 Claims, 4 Drawing Sheets

(58) Field of Classification Search
USPC ............................................ 307/112
See application file for complete search history.

(56) References Cited

U.S. PATENT DOCUMENTS

| | | | | |
|---|---|---|---|---|
| 5,619,137 | A * | 4/1997 | Vig | G01R 33/07 |
| | | | | 324/207.12 |
| 7,548,056 | B2 * | 6/2009 | Voisine | G01D 5/247 |
| | | | | 324/207.12 |
| 9,329,057 | B2 * | 5/2016 | Foletto | G01D 5/2448 |
| 9,520,871 | B2 * | 12/2016 | Eagen | H03K 17/24 |
| 9,778,326 | B2 * | 10/2017 | Chen | G01R 33/0029 |
| 2019/0222212 | A1 * | 7/2019 | Wang | H03K 17/9517 |

* cited by examiner

PROXIMITY MAGNETIC INDUCTION SWITCH CONTROL CHIP AND ITS CONTROL METHOD

CROSS-REFERENCE TO RELATED APPLICATIONS

This application is the International Application No. PCT/CN2017/075776 for entry into US national phase with an international filing date of Mar. 6, 2017 designating US, now pending, the content of which is incorporated herein by reference in its entirety.

TECHNICAL FIELD

The invention relates to the technical field of proximity switch, in particular to a proximity type magnetic induction switch control chip and a control method thereof.

BACKGROUND TECHNOLOGY

Traditional proximity sensors are mainly used in industrial automation equipment and assembly line automation detection and so on. It relates to an inductive proximity switch, a safety explosion-proof proximity switch, an inductance analog output proximity switch, a magnetic induction proximity switch and a capacitive proximity switch. No matter what kind of mode of proximity sensor, it generally includes three parts, one is the power supply part which receives or generates the induction signal, the other is the main circuit part of the identification and processing. The third part is the controlled switching device which is turned on or off as a switch function.

For the power supply part which receives or produces induction signal, there are many kinds of technical scheme at present. One kind of technical scheme is to supply the sensor module with the input main power source directly without any power supply processing. This method must choose the corresponding specification of the device (voltage and current are enough to withstand the impact), at the same time, the device size can meet the power requirements, the overall size is too large and it is used in simple low-cost, low-precision occasions. Another technical scheme is to separate the components of the power supply and do special step-down processing or linear voltage stabilization processing to meet the application requirements of high accuracy, high stability and low power consumption.

For the main circuit part of the identification and processing, the main part is to sample and process the induction signal in time and send the driving signal to the main switch device. It is necessary to sample accurately and quickly and has enough driving ability to drive the load operation.

According to different application requirements and application environments, there are many ways to deal with the controlled switching devices which are turned on and off as switches. 1, simply use Triode drive circuit, namely the conventional independent PNP or NPN Triode as the main switching device; 2, Integrated PNP or NPN Triode synthesis application, but it must distinguish wiring; In essence, it is still a single application that can only correspond to a specified load; 3, the mechanical switch control mode with direct contact, such as a spring or a live coil, closes or opens under the action of induction force and when the induction force disappears, the switching device is automatically restored to its original state under the action of a spring or similar inertial force.

The power supply part of the receiving or generating induction signal part, the main circuit part of the identification and processing and the controlled switch device part of the switch function on and off are combined and according to the actual application requirements on the specified circuit board, the application structure frame of the conventional proximity switch is formed.

The existing application scheme is composed of three parts: the power supply part which receives or produces the induction signal, the main circuit part of the signal recognition and processing, and the controlled switch device which is turned on or off as a switch function. And they are all composed of discrete components, and the circuits are scattered and messy.

The output load includes NPN type drive load structure and PNP type drive load structure. The current application scheme must on the basis of understanding the load type, pertinently adopt the corresponding drive structure circuit structure, otherwise it cannot drive normally. For example, for the NPN type load structure, the corresponding proximity switch drive circuit must be the NPN type drive circuit, for the PNP type load structure, the corresponding proximity switch drive circuit must be the PNP type drive circuit. It cannot achieve the same circuit that can be compatible with the drive of the two structures of the load.

Technical Problem

The invention aims to provide a proximity type magnetic induction switch control chip and a control method thereof, aiming at solving the problem existing in the prior technique that the same circuit cannot be compatible with the loads of two kinds of driving structures.

Solution to the Technical Problem

Technical Solution

The invention is realized as follows: first, a proximity type magnetic induction switch control chip is provided; the voltage output terminal of the proximity type magnetic induction switch control chip is connected with the voltage input terminal of the Hall device; The signal input terminal of the proximity type magnetic induction switch control chip is connected with the signal output terminal of the Hall device. The control chip includes a voltage regulator module, a control module, an output type detection module, a first controllable switch and a second controllable switch.

The control module is respectively connected with a control terminal of the voltage regulator module, an output terminal of the output type detection module, a control terminal of the first controllable switch and a control terminal of the second controllable switch. The input terminal of the first controllable switch, the first input terminal of the output type detection module and the voltage input terminal of the voltage regulator module are connected together and constitute the voltage input terminal of the proximity magnetic induction switch control chip. The output terminal of the first controllable switch, the output terminal of the second controllable switch and the second input terminal of the output type detection module are connected together and constitute the signal output terminal of the proximity magnetic induction switch control chip. The input terminal of the second controllable switch and the third input terminal of the output type detection module are connected to the ground and constitute the grounding terminal of the proximity magnetic induction switch control chip. The output terminal of the voltage regulator module is the voltage output terminal of the proximity type magnetic induction switch control chip, and the input terminal of the control module is the signal input terminal of the proximity type magnetic induction switch control chip.

The voltage regulator module outputs the input voltage to the Hall device for power supply after adjusting the input voltage.

When the output type detection module detects the load connected between the voltage input terminal and the signal output terminal of the proximity type magnetic induction switch control chip or the load connected between the signal output terminal of the control chip and the grounding terminal, it sends the detection result to the control module;

The control module processes the induction signal sent by the Hall device and controls the first controllable switch or the second controllable switch to actuate the load according to the detection result.

In combination with the first aspect, as a first embodiment of the first aspect, the proximity magnetic induction switch control chip also includes a LED drive module, and an input terminal of the LED drive module is connected with an output terminal of the control module. The output terminal of the LED driving module is connected with the first LED lamp and the second LED lamp. When the controller module controls the first controllable switch to be turned on, the LED driving module is driven to make the first LED lamp work. When the controller module controls the second controllable switch to be turned on, the LED driving module is driven to make the second LED lamp work.

In combination with the first aspect, as a second embodiment of the first aspect, the output type detection module includes a third resistance, a fourth resistance and a comparator, and the first terminal of the third resistance is the first input of the output type detection module. The second terminal of the third resistance is connected to the first terminal of the fourth resistance and an in-phase input of the comparator, and the inverted input of the comparator is a second input of the output type detection module. The second terminal of the fourth resistance is the third input terminal of the output type detection module, and the output terminal of the comparator is the output terminal of the output type detection module.

In combination with the first aspect, as a third embodiment of the first aspect, when the control module detects an output current anomaly, the LED drive module is driven so that the first LED lamp or the second LED lamp is in a flashing state. The first controllable switch or the second controllable switch is turned on again when the induction signal is detected and the protection working state is continuously in the present time.

In combination with the first aspect, as a first embodiment of the first aspect, the proximity magnetic induction switch control chip also includes a low-voltage locking module, and the input terminal of the low-voltage locking module is connected with the voltage input terminal of the control chip. The output terminal of the low-voltage locking module is connected with the input terminal of the control module;

When a power source is connected between a voltage input terminal of the control chip and a grounding terminal, a power source is connected between the output terminal of the control chip and the grounding terminal, or a load is connected between the voltage input terminal of the control chip and the grounding terminal. The low-voltage locking module is in a locking state, and the control module controls the voltage regulator module to stop working.

The second aspect of the invention provides a control method of a proximity type magnetic induction switch control chip. The voltage output terminal of the proximity type magnetic induction switch control chip is connected with the voltage input terminal of the Hall device. The signal input terminal of the proximity type magnetic induction switch control chip is connected with the signal output terminal of the Hall device. The control chip includes a voltage regulator module, a control module, an output type detection module, a first controllable switch and a second controllable switch.

The control module is respectively connected with a control terminal of the voltage regulator module, an output terminal of the output type detection module, a control terminal of the first controllable switch and a control terminal of the second controllable switch. The input terminal of the first controllable switch, the first input terminal of the output type detection module and the voltage input terminal of the voltage regulator module are connected together and constitute the voltage input terminal of the proximity magnetic induction switch control chip. The output terminal of the first controllable switch, the output terminal of the second controllable switch and the second input terminal of the output type detection module are connected together and constitute the signal output terminal of the proximity magnetic induction switch control chip. The input terminal of the second controllable switch and the third input terminal of the output type detection module are connected to the ground. The output terminal of the voltage regulator module is the voltage output terminal of the proximity type magnetic induction switch control chip, and the input terminal of the control module is the signal input terminal of the proximity type magnetic induction switch control chip.

The control method includes the following steps:

The voltage regulator module outputs the input voltage to the Hall device for power supply after adjusting the input voltage.

When the output type detecting module detects the connected load between the voltage input terminal and the output terminal of the control chip, or the connected load between the output terminal of the control chip and the ground terminal, the detection result is sent to the control module.

The control module processes the induction signal sent by the Hall device and controls the first controllable switch or the second controllable switch to actuate the load according to the detection result.

In combination with the second aspect, as a first embodiment of the second aspect, the proximity magnetic induction switch control chip also includes a LED drive module, and the input terminal of the LED drive module is connected with the output terminal of the control module. The output terminal of the LED drive module is connected with the first LED lamp and the second LED lamp.

The control method also includes:

When the controller module controls the first controllable switch to be turned on, the LED driving module is driven to make the first LED lamp work.

When the controller module controls the second controllable switch to be turned on, the LED driving module is driven to make the second LED lamp work.

In combination with the first embodiment of the second aspect, as the second embodiment of the second aspect, when the control module detects an output current anomaly, the LED drive module is driven so that the first LED lamp or the second LED lamp is in a flashing state. The first controllable switch or the second controllable switch is turned on again when the induction signal is detected and the protection working state is continuously in the present time.

In combination with the second aspect, as a third embodiment of the second aspect, the proximity magnetic induction switch control chip also includes a low-voltage locking module, and the input terminal of the low-voltage locking module is connected with the voltage input terminal of the control chip. The output terminal of the low-voltage locking module is connected with the input terminal of the control module;

The control method also includes:

When a power source is connected between a voltage input terminal and a ground terminal of the control chip, a power source is connected between the output terminal and the ground terminal of the control chip, or a load is connected between the voltage input terminal and the ground terminal of the control chip, The low-voltage locking module is in a locking state and the control module controls the voltage regulator module to stop working.

Beneficial Effect of the Invention

Beneficial Effect

The embodiment of the invention provides a proximity type magnetic induction switch control chip and a control method thereof. The control chip highly integrates a plurality of modules, simplifies the external circuit and reduces the design size area and wiring space of the application. It better meets the practical requirements of modern application integration miniaturization and can automatically identify the type of the load and automatically select the switching circuit structure. It can be compatible with NPN and PNP output load types. The utility model improves the flexibility and convenience of the application and can realize the application requirements of high accuracy, low power consumption, high integration, multi-protection function and wide voltage application range.

BRIEF DESCRIPTION TO THE DRAWINGS

Description to the Drawings

In order to provide a clearer description of the technical scheme in the embodiments of the present invention, the drawings to be used in the embodiments or in the prior technique description will be briefly described as below. Obviously, the drawings described below are only some embodiments of the present invention and for those of ordinary technical personnel in this field other drawings may be obtained on the basis of these drawings without creative labor.

EMBODIMENTS OF THE INVENTION

Embodiments of the Present Invention

In order to make the purpose, technical proposal and advantages of the invention more clear, the present invention is further explained in detail with the attached drawings and embodiments as following. It should be understood that the specific embodiments described herein are intended only to explain the present invention and are not intended to qualify the invention.

In order to illustrate the technical proposal of the present invention a specific embodiment is provided as below.

Figure 1:
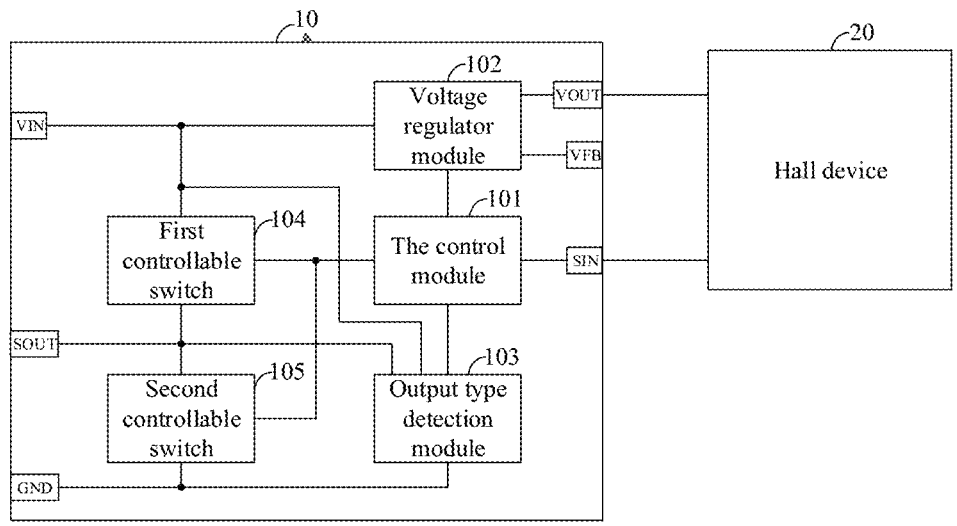
FIG. 1 is a configuration schematic diagram of a proximity magnetic induction switch control chip provided by an embodiment of the present invention.
Figure 2:
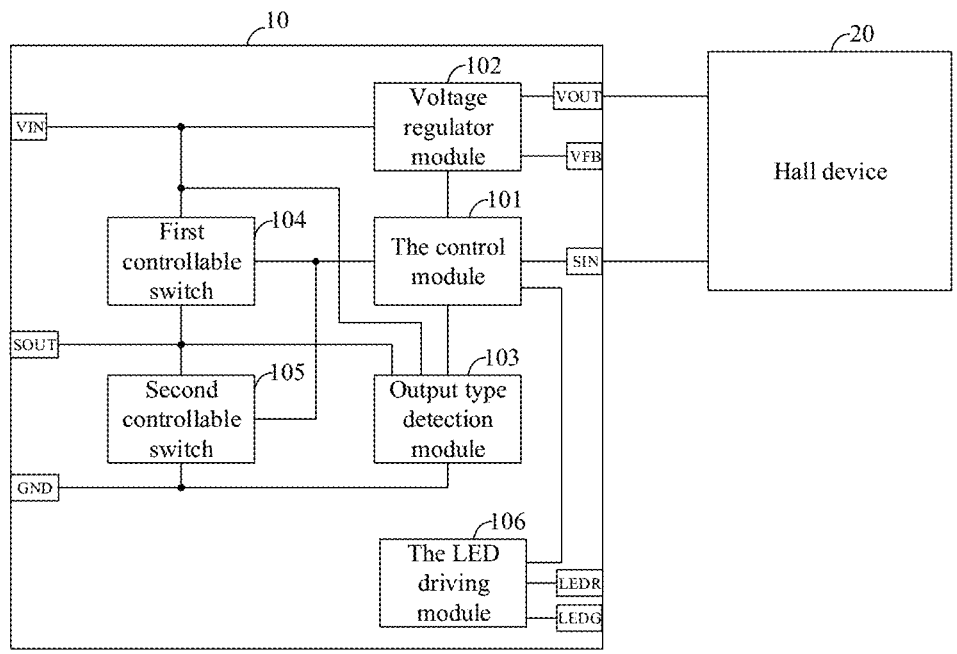
FIG. 2 is a configuration schematic diagram of a proximity magnetic induction switch control chip provided by another embodiment of the present invention.

The embodiment of the invention provides a proximity magnetic induction switch control chip 10. As shown in FIG. 1, the voltage output terminal VOUT of the proximity magnetic induction switch control chip 10 is connected to the voltage input terminal of the Hall device 20. The signal input terminal SIN of the proximity magnetic induction switch control chip 10 is connected to the signal output terminal of the Hall device 20. The proximity magnetic induction switch control chip 10 includes a voltage regulator module 102, a control module 101, an output type detection module 103, a first controllable switch 104 and a second controllable switch 105.

The control module 101 is respectively connected with a control terminal of the voltage regulator module 102, an output terminal of the output type detection module 103, a control terminal of the first controllable switch 104 and a control terminal of the second controllable switch 105. The input terminal of the first controllable switch 104, the first input terminal of the output type detection module 103 and the voltage input terminal of the voltage regulator module 102 are connected together to form a voltage input terminal VIN of the proximity magnetic induction switch control chip 10. The output terminal of the first controllable switch 104, the output terminal of the second controllable switch 105 and the second input terminal of the output type detection module 103 are connected together to form a signal output terminal SOUT of the proximity magnetic induction switch control chip 10. The input terminal of the second controllable switch 105 and the third input terminal of the output type detection module 103 are connected to the ground and constitute the grounding terminal GND of the proximity magnetic induction switch control chip 10. The output terminal of the voltage regulator module 102 is the voltage output terminal VOUT of the proximity magnetic induction switch control chip. The input terminal of the control module 101 is the signal input SIN of the proximity magnetic induction switch control chip 10.

The voltage regulator module 102 outputs the input voltage to the Hall device 20 after adjusting the input voltage.

The output type detection module 103 detects the connection load between the voltage input terminal VIN of the control chip 10 and the signal output terminal SOUT of the control chip 10 or the connection load between the signal output terminal SOUT of the control chip 10 and the ground terminal GND and sends the detection result to the control module 101.

The control module 101 processes the induction signal transmitted by the Hall device 20 and controls the first controllable switch 104 or the second controllable switch 105 to switch on to drive the load operation according to the judgment result.

In the embodiment of the invention, the voltage input terminal VIN of the control chip 10 is connected with the GND of the grounding terminal, the voltage input terminal VIN is the positive electrode of the DC power supply, and the grounding terminal GND is the negative electrode of the DC power supply. The voltage range of input voltage is 2.7-36V, which is compatible with most of the power supply range in the market. It is not necessary to consider the influence of voltage range on the application of the system.

In the embodiment of the invention, the voltage regulator module 102 is a voltage regulating circuit inside the proximity magnetic induction switch control chip 10, which is mainly used for supplying power to an external Hall sensor. The input voltage of 2.7-36V is converted to a suitable supply voltage by the voltage regulator module and it is output from the voltage output terminal VOUT. The driving current of the voltage output terminal VOUT is set at 10 mA, and the maximum overcurrent protection is 50 mA. Because there are many types of devices connected at the voltage output terminal, and the voltage is different, the output voltage can be obtained by setting the resistance value connected by the feedback terminal VFB, without the need to re-adopt different voltage to adjust circuits. Since the voltage regulator module can adopt various voltage conversion modules of the prior technique, the specific structure of the voltage regulator module is not described here.

In the embodiment of the invention, the first controllable switch 104 and the second controllable switch 105 can adopt the MOS tube to control the combination application of the MOS tube inside the chip 10 by the proximity magnetic induction switch control chip 10, which improves the response speed and reduces the power consumption of the device itself. And the design of the MOS tube can support a larger rated current and a smaller conduction loss, in which the MOS tube can be a PMOS tube or a NMOS tube. As an implementation method, the first controllable switch 104 and the second controllable switch 105 can be adopted in the PMOS tube and the NMOS tube respectively. Among of them, the controlled switching device output terminal SOUT of the proximity magnetic induction switch control chip 10 is connected to the source output terminal of the pull-up PMOS tube and the drain input terminal of the pull-down NMOS tube inside the chip. Through the combination application of PMOS tube and NMOS tube inside the proximity magnetic induction switch control chip 10, the response speed is improved, and the PMOS tube and the NMOS tube can be selected according to the connection condition of the load and can reach the application situation which is compatible with different loads. Among them, two MOS tubes adopt the specification of withstanding voltage 40V and current 0.5 A, which reserve enough allowance for the practical application of conventional maximum 0.2 A.

For the output type detection module 103, by setting the output type detection module 103, the control chip 10 has the function of automatic load access detection that is the port position of the load access to proximity magnetic induction switch control chip 10 can be detected. When the load is connected between the output signal terminal SOUT and the grounding terminal GND, the output terminal SOUT of the proximity magnetic induction switch control chip 10 is in a high resistance state and is biased near the VIN/2 potential by the internal circuit. When the load is connected between the output terminal SOUT and the grounding terminal GND, it is equivalent to connecting an impedance in parallel between the output terminal SOUT and the grounding terminal GND that is resulting in the output terminal SOUT has a potential lower than that of the VIN/2. When the load is connected between the voltage input terminal VIN and the output terminal SOUT, it is equivalent to connecting impedance in parallel between the voltage input terminal VIN and the output terminal SOUT, thus causing the potential of the output terminal SOUT to be higher than the potential of the VIN/2. In this way, by detecting the potential of the output terminal SOUT, the location of the load access is detected.

Figure 5:
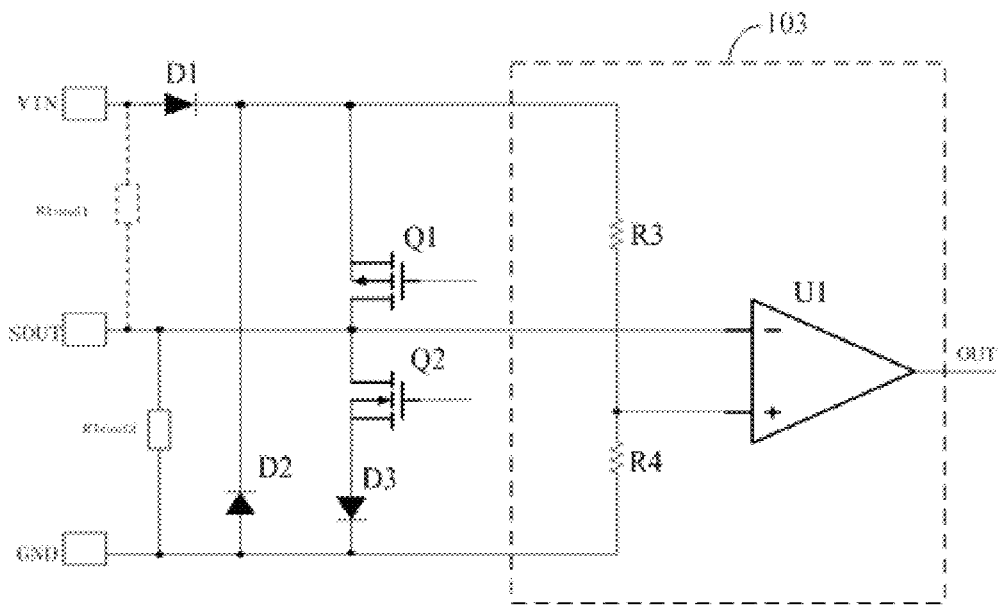
FIG. 5 is a partial circuit diagram of a proximity magnetic induction switch control chip provided by an embodiment of the present invention.

Specifically, as an embodiment, as shown in FIG. 5, the output type detection module 103 includes a third resistance R3, a fourth resistance R4 and a comparator U1, and the first terminal of the third resistance R3 is a first input terminal of the output type detection module 103; The second terminal of the third resistor R3 is connected to the first terminal of the fourth resistor R4 and the in-phase input terminal of the comparator U1, and the inverting input terminal of the comparator U1 is the second input terminal of the output type detection module 103. The second terminal of the fourth resistance R4 is the third input terminal of the output type detection module 103, and the output terminal of the comparator U1 is the output terminal of the output type detection module 103.

Further, the proximity type magnetic induction switch control chip 10 also includes an LED driving module 106 and an input terminal of LED driving module 106 is connected with an output terminal of the control module 101. The output terminal of the LED driving module 106 is connected with a first LED lamp and a second LED lamp.

When the controller module controls the first controllable switch 104 to switch on, the LED driving module 106 is driven to make the first LED lamp work.

When the controller module controls the second controllable switch 105 to switch on, the LED driving module 106 is driven to make the second LED lamp work.

Figure 3:
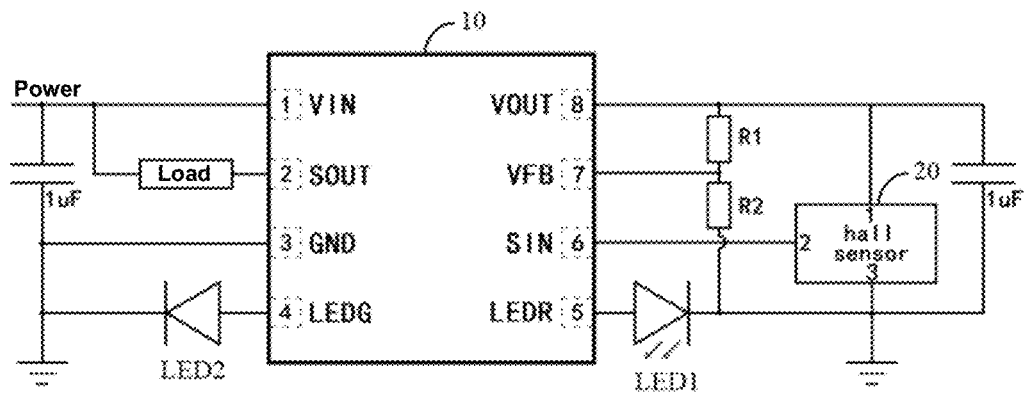
FIG. 3 is a working state schematic diagram of a proximity magnetic induction switch control chip provided by an embodiment of the present invention.

In particular, after the automatic detection of the load input type is completed, the state of use of the first controllable switch and the second controllable switch can be displayed through the first LED lamp and the second LED lamp. In particular, when the first controllable switch and the second controllable switch adopt the NMOS tube and the PMOS tube respectively, the specific working process of the NMOS tube and the PMOS tube is as follows:

The output working process of the NMOS transistor structure is as follows: As shown in FIG. 3, the control chip 10 provides a configurable stable voltage (error ±2%) to the Hall device 20 with a maximum voltage not exceeding the Vin-0.3V. When the Hall device 20 senses the action taking place, the second pin of the Hall device 20 outputs a high level. The input terminal SIN of the control chip 10 receives a signal and turns on the NMOS tube to supply power to the load. When the voltage on the load is about VIN-1V, the LEDR port outputs the high level, thereby lighting up the red indicator light.

Figure 4:
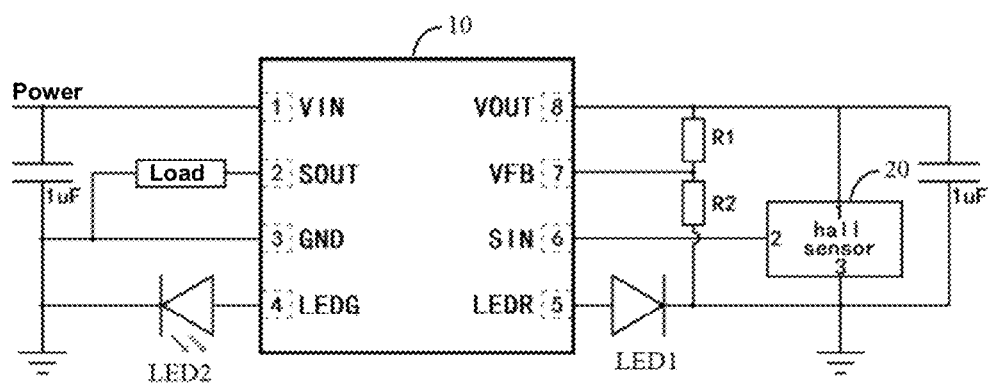
FIG. 4 is a working state schematic diagram of a proximity magnetic induction switch control chip provided by an embodiment of the present invention.

The output working process of the PMOS tube structure is as follows: as shown in FIG. 4, the control chip 10 provides a configurable stable voltage (error ±2%) to the Hall device 20 with a maximum voltage not exceeding the Vin-0.3V. When the Hall device 20 senses the action taking place, the second pin of the Hall device 20 outputs a high level, and the input terminal SIN of the control chip 10 receives a signal and turns on the PMOS tube to supply power to the load. When the voltage on the load is about VIN-1V, the LEDG port outputs a high level to turn on the green indicator, specifically, the status of the red or green light as shown in the light status table provided in Table 1 below:

TABLE 1 light status table

| | The load is working normally | Load work exception (output open/short circuit) |
|---|---|---|
| When Hall action occurs N-tube structure output | The red light is on and the green light is not on. | The red light flashes and the green light is not on. |
| P-tube structure output | The red light is not on, the green light is on. | The red light is not on and the green light is flashes. |

Further, referring to table 1 above, when an output current anomaly is detected by the control module 101, the drive LED drive module 10 6 causes the first LED lamp or the second LED lamp to flicker. When the protection is continuously in operation for a preset time and an induction signal is detected, the first controllable switch 104 or the second controllable switch 105 is reactivated.

Figure 6:
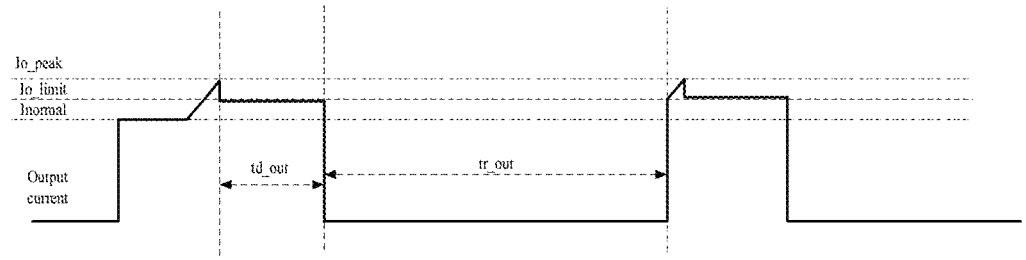
FIG. 6 is an output current waveform diagram of a proximity magnetic induction switch control chip provided by an embodiment of the present invention.

In particular as shown in FIG. 6 when the control module 101 detects that the output current exceeds the Io_peak threshold and maintains the excess 4 uS the current limiting protection is triggered at which the output current is limited to the Io_limit until the output current falls within the normal operating current range. If the control chip 10 has been working in the current limiting state for a long time, such as exceeding the time of the 4 mS, then the control chip 10 enters the CUT-OFF mode and disconnects the output power path by controlling the controllable switch, after the closing time of the 60 mS. If the input terminal SIN signal is still active, turn on the control switch repeatedly and then enter the burping mode.

Figure 7:
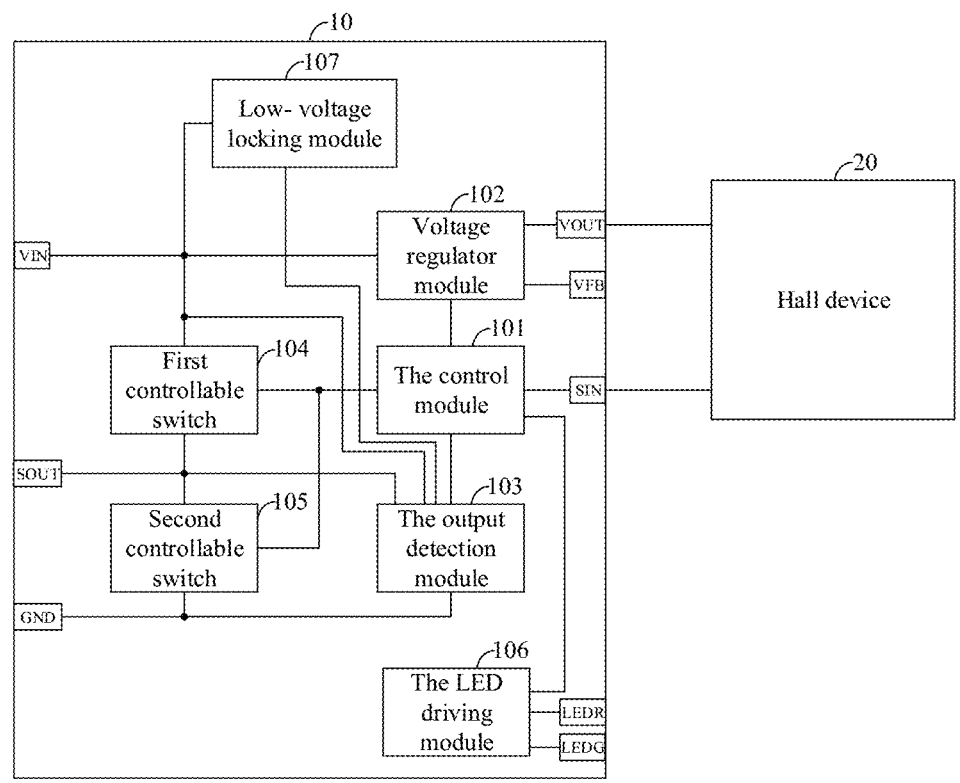
FIG. 7 is a configuration schematic diagram of a proximity magnetic induction switch control chip provided by another embodiment of the present invention.

Further, as shown in FIG. 7, the proximity type magnetic induction switch control chip 10 also includes a low-voltage locking module 107, a voltage input terminal of the low-voltage locking module 107 is connected to the voltage input terminal VIN of the control chip 10, and the output terminal of the low-voltage locking module 107 is connected to the input terminal of the control module 101.

When a power supply is connected between the voltage input terminal VIN of the control chip 10 and the grounding terminal GND, and a power supply is connected between the signal output terminal SOUT of the control chip 10 and the grounding terminal GND, or a load is connected between the voltage input terminal VIN of the control chip 10 and the grounding terminal GND, the low-voltage locking module is in a locked state, and the control module 101 controls the voltage regulator module 102 to stop operation.

In particular, the embodiment of the invention realizes the anti-reverse connection function design by setting the low-voltage locking module 107. As shown in FIG. 7, when the control chip 10 is in normal application, the whole control chip 10 will eventually be connected with only three wires outwards. They are the positive electrode of power line (VIN), the negative electrode of power line (GND) and the load output line (SOUT) and it has special color line corresponding to them respectively. During the application of these three lines, the operator cannot identify the port corresponding to each line, there may be a misconnection. There are several situations, such as the following: the positive electrode of the power line VIN is connected back to the negative electrode of the power line GND, the positive electrode of the power line VIN is interchanged with the output terminal SOUT and the output terminal SOUT is interchanged with the negative electrode of the power line GND. By setting a low-voltage locking module inside the chip to monitor the load connected between the voltage input terminal VIN and the signal output terminal SOUT, the three pins of the VIN/SOUT/GND of the control chip 10 can be provided with the function of preventing reverse connection.

Specifically, when the load is connected between the output terminal SOUT and the negative electrode of power line GND, and the power supply is connected between the positive electrode of power line VIN and the negative electrode of power line GND, the control chip is powered on normally and the voltage regulator module 102 starts to work. At the same time the output type detection module 103 detects that the load is connected between the SOUT and the GND, and the control module 101 receives the induction signal from the input SIN and turns on the PMOS tube; since the power supply voltage is at both ends of the PMOS at this time, the PMOS overcurrent is detected and then the burp is repeatedly detected. At the same time the flashing light indicates that the load is abnormal until the SIN signal is pulled down or the low-voltage locking module is triggered by a complete shutdown signal.

When the load is connected between the positive electrode of power line VIN and the output terminal SOUT, and the power supply is connected between the output terminal SOUT and the negative electrode of power supply line GND, the control chip 10 is powered on normally and the voltage regulator module 102 is turned on. At the same time the polarity detects the load is connected between the SOUT and the VIN, control module 101 issued from the input terminal SIN and turned on the NMOS tube; because the NMOS tube is at both ends of the power supply voltage, it will detect the NMOS tube overcurrent and repeatedly burp while flashing light instructions until the SIN signal pull low or low-voltage locking module and other complete shutdown signal trigger.

When a power supply is connected between the voltage input terminal of the control chip 10 and the grounding terminal, a power supply is connected between the output terminal of the control chip 10 and the grounding terminal, or a load is connected between the voltage input terminal of the control chip 10 and the grounding terminal, after the control chip 10 is energized, the load lowers the VIN voltage at the voltage input terminal, the low-voltage locking module detects the voltage of the VIN at the input voltage input terminal, judges that the low-voltage locking module cannot be released in the locked state and the control chip does not work.

The system working sequence of the embodiment of the invention is as follows: when the system is powered on, the input voltage is first detected to meet the minimum voltage, the under voltage lock is released, if the voltage is normal, the system clock is started and the voltage regulator module 102 is enabled to work. The output type detection module 103 starts up synchronously and work all the time. After the voltage regulator module 102 works normally, it supplies power to the Hall device 20. When the Hall device 20 detects the action, the SIN terminal of the control chip 10 receives the signal and turns on the PMOS tube or the NMOS tube correctly. When the system load is abnormal or open circuit, then it enters the protection working state and triggers the indicator lamp for warning flashing, after the fault is lifted, the system will resume normal work.

Another embodiment of the invention provides a control method of a proximity type magnetic induction switch control chip. The voltage output terminal of the proximity type magnetic induction switch control chip is connected with a voltage input terminal of a Hall device. The signal input terminal of the proximity magnetic induction switch control chip is connected with the signal output terminal of the Hall device. The control chip comprises a voltage regulator module, a control module, an output type detection module, a first controllable switch and a second controllable switch.

The control module is respectively connected with the control terminal of the voltage regulator module, the output terminal of the output type detection module, the control terminal of the first controllable switch and the control terminal of the second controllable switch. The input terminal of the first controllable switch, the first input terminal of the output type detection module and the voltage input terminal of the voltage regulator module are connected together to form the voltage input terminal of the proximity magnetic induction switch control chip. The output terminal of the first controllable switch, the output terminal of the second controllable switch and the second input terminal of the output type detection module are connected together to form a signal output terminal of the proximity magnetic induction switch control chip. The input terminal of the second controllable switch and the third input terminal of the output type detection module are connected to the ground and form the grounding terminal of the proximity magnetic induction switch control chip. The output terminal of the voltage regulator module is the voltage output terminal of the proximity magnetic induction switch control chip, and the input terminal of the control module is the signal input terminal of the proximity magnetic induction switch control chip.

Figure 8:
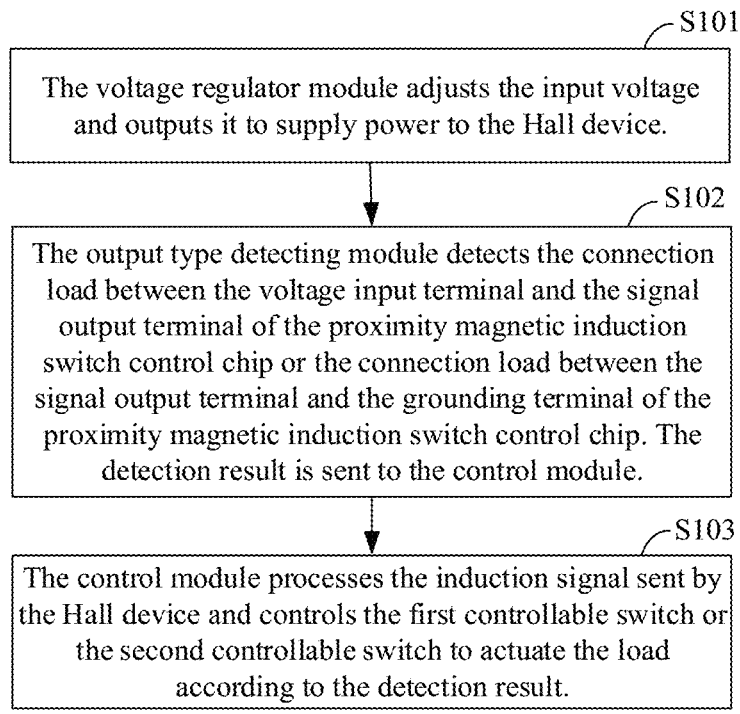
FIG. 8 is a flowchart of a control method of a proximity magnetic induction switch control chip provided by another embodiment of the present invention.

As shown in FIG. 8, the control method includes:

Step S101. The voltage regulator module adjusts the input voltage and outputs the power to the Hall device.

Step S102. The output type detection module detects the load connected between the voltage input terminal and the signal output terminal of the proximity magnetic induction switch control chip or the load connected between the signal output terminal and the grounding terminal of the proximity magnetic induction switch control chip. The detection result is sent to the control module.

Step S103. The control module processes the induction signal sent by the Hall device and controls the first controllable switch or the second controllable switch to actuate the load according to the detection result.

Further, the proximity type magnetic induction switch control chip also comprises a LED driving module; an input terminal of the LED driving module is connected with an output terminal of the control module, and an output terminal of the LED driving module is connected with a first LED lamp and a second LED lamp.

The control method also includes:

Step S104. When the controller module controls the first controllable switch to be turned on, the LED driving module is driven to make the first LED lamp work.

Step S105. When the controller module controls the second controllable switch to be turned on, the LED driving module is driven to make the second LED lamp work.

Further, when the control module detects the abnormal output current, the driving LED driving module makes the first LED lamp or the second LED lamp flicker, and continues to operate in the protective state for a preset time and detects the induction signal, the first controllable switch or the second controllable switch is reactivated.

Further, the proximity type magnetic induction switch control chip also comprises a low-voltage locking module, an input terminal of the low-voltage locking module is connected with the voltage input terminal of the control chip and an output terminal of the low-voltage locking module is connected with the input terminal of the control module.

The control method also includes:

Step S106. When a power supply is connected between the voltage input terminal and the grounding terminal of the control chip, a power supply is connected between the output terminal and the grounding terminal of the control chip, or a load is connected between the voltage input terminal and the grounding terminal of the control chip, the low-voltage locking module is in the locked state and the control module controls the voltage regulator module to stop working.

Figure 9:
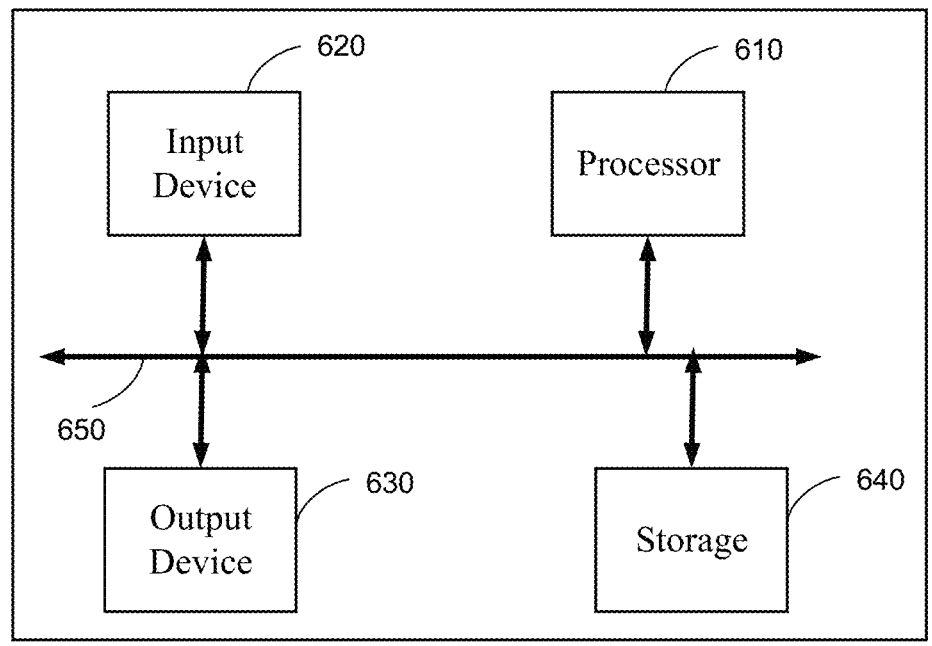
FIG. 9 is a configuration schematic diagram of a proximity magnetic induction switch control chip provided by another embodiment of the present invention.

As shown in FIG. 9 is a terminal schematic block diagram provided by another embodiment of the present invention. A terminal in the present embodiment as illustrated may include one or more processors 610; one or more input devices 620; one or more output devices 630 and memory 640. The processor 610, the input device 620, the output device 630 and the memory 640 are connected with the bus 650.

The memory 640 is used for storing program instructions.

Processor 610 is used to perform the following operations in accordance with program instructions stored in memory 640:

The processor 610 is used for supplying power to the Hall device after the input voltage is adjusted.

When the output type detecting module detects the load connected between the voltage input terminal and the signal output terminal of the proximity type magnetic induction switch control chip, or the connected load between the signal output terminal and the grounding terminal of the control chip, the detection result is sent to the control module; the induction signal sent by the Hall device is processed, and the first controllable switch or the second controllable switch is controlled according to the detected result to drive the load.

Further, the processor 610 is also used to drive the LED driving module to cause the first LED lamp to work when the first controllable switch is switched on.

Alternatively, the processor 610 is also used to drive the LED driving module to cause the second LED lamp to work when the second controllable switch is switched on.

Alternatively, the processor 610 is also used to drive the LED drive module to flicker the first LED lamp or the second LED lamp when an output current anomaly is detected.

The first controllable switch or the second controllable switch is turned on again when the induction signal is detected and the protective working state is set for a preset time continuously.

Alternatively, processor 610 is also used when a power supply is connected between a voltage input terminal and a grounding terminal of the control chip, a power source is connected between the output terminal of the control chip and a grounding terminal, or a load is connected between the voltage input terminal and the grounding terminal of the control chip, the low-voltage locking module is in a locking state and the control module controls the voltage regulator module to stop working.

It should be understood that in embodiments of the present invention, the processor 610s may be a central processing unit (Central Processing Unit, CPU), other general purpose processors, a digital signal processor (Digital Signal Processor, DSP), an application specific integrated circuit (Application Specific Integrated Circuit,) ASIC, Field-Programmable Gate Array (Field-Programmable Gate Array, FPGA) or other programmable logic devices, discrete gate or transistor logic devices, discrete hardware components, etc. The general purpose processor may be a microprocessor or the processor may be any conventional processor or the like.

The input device can include a trackpad, microphone, wearable device, etc., and the output device can include a display (LCD, etc.), a speaker, and so on.

The memory 640 may include a read-only memory and a random access memory and provide instructions and data to the processor 610. A portion of the memory 640 may also include a non-volatile random access memory. For example the memory 640 may also store information of the device type.

In particular, the processor 610, the input device 620 and the output device 630 described in the embodiment of the present invention may execute the implementation described in the above embodiment of an identification method with fingerprint identification function of a terminal provided by an embodiment of the present invention; The implementation of the terminals described in embodiments of the present invention may also be performed and will not be repeated herein.

The embodiment of the invention provides a proximity type magnetic induction switch control chip and a control method thereof. The control chip is highly integrated with a plurality of modules and can automatically recognize the type of the load received and automatically select the switching circuit structure. According to the need to flexibly set the sensor supply voltage, compatible with conventional applications of various input voltages, using MOSFET transistor instead of the traditional transistor to do controlled switching devices in order to achieve the application requirements of high accuracy, low power consumption, high integration, multi-protection function and wide range of voltage applications.

The embodiment of the invention is compatible with and unifies the application mode of the prior technique separation device, simplifies the external circuit by the internal design of most of the devices and functions and reduces the design size, area and wiring space of the application to better meet the practical requirements of the miniaturization of modern application integration.

Compared with the existing application technology, the invention adds perfect protection functions, such as anti-reverse connection protection of the input and output, open-circuit short-circuit protection, can be compatible with two output load types of NPN and PNP, and improves the flexibility and convenience of the application.

The above content is a further detailed description of the invention in connection with a specific preferred embodiment and it cannot be determined that the specific implementation of the invention is limited to these descriptions. For a person of ordinary skill in the technical field to whom the invention belongs, a number of equivalent substitutions or obvious variants are made without departing from the idea of the invention and have the same performance or use, all of which shall be regarded as falling within the scope of patent protection as determined by the claims submitted herein.

What is claimed is:

1. A proximity type magnetic induction switch control chip, wherein the voltage output terminal of the proximity type magnetic induction switch control chip is connected with the voltage input terminal of the Hall device, the signal input terminal of the proximity type magnetic induction switch control chip is connected with the signal output terminal of the Hall device, which is characterized in that: the proximity type magnetic induction switch control chip includes a voltage regulator module, a control module, an output type detecting module, a first controllable switch and a second controllable switch, wherein the control module is respectively connected with a control terminal of the voltage regulator module, an output terminal of the output type detection module, a control terminal of the first controllable switch and a control terminal of the second controllable switch, the input terminal of the first controllable switch, the first input terminal of the output type detection module and the voltage input terminal of the voltage regulator module are connected together and constitute the voltage input terminal of the proximity magnetic induction switch control chip, the output terminal of the first controllable switch, the output terminal of the second controllable switch and the second input terminal of the output type detection module are connected together and constitute the signal output terminal of the proximity magnetic induction switch control chip, the input terminal of the second controllable switch and the third input terminal of the output type detection module are connected to the ground and constitute the ground terminal of the proximity magnetic induction switch control chip, the output terminal of the voltage regulator module is the voltage output terminal of the proximity type magnetic induction switch control chip, and the input terminal of the control module is the signal input terminal of the proximity type magnetic induction switch control chip;

wherein the voltage regulator module outputs the input voltage to the Hall device for power supply after adjusting the input voltage;

wherein when the output type detection module detects the load connected between the voltage input terminal and the signal output terminal of the proximity type magnetic induction switch control chip or the load connected between the signal output terminal of the control chip and the grounding terminal, it sends the detection result to the control module; and wherein the control module processes the induction signal sent by the Hall device and controls the first controllable switch or the second controllable switch to actuate the load according to the detection result.

2. The proximity magnetic induction switch control chip of claim 1, wherein the proximity type magnetic induction switch control chip also includes a LED drive module and the input terminal of the LED drive module is connected with the output terminal of the control module. The output terminal of the LED driving module is connected with the first LED lamp and the second LED lamp;

wherein when the controller module controls the first controllable switch to be turned on, the LED driving module is driven to make the first LED lamp work;

wherein when the controller module controls the second controllable switch to be turned on, the LED driving module is driven to make the second LED lamp work.

3. The proximity magnetic induction switch control chip of claim 1, wherein the output type detection module includes a third resistance, a fourth resistance and a comparator. The first terminal of the third resistance is the first input terminal of the output type detection module, and the second terminal of the third resistance is connected with the first terminal of the fourth resistance and the in-phase input of the comparator. The inverted input terminal of the comparator is the second input terminal of the output type detection module, and the second terminal of the fourth resistance is the third input terminal of the output type detection module. The output terminal of the comparator is the output terminal of the output type detection module.

4. The proximity magnetic induction switch control chip of claim 2, wherein when the control module detects an output current anomaly, the LED drive module is driven so that the first LED lamp or the second LED lamp is in a flashing state;
wherein the first controllable switch or the second controllable switch is turned on again when the induction signal is detected and the protection working state is continuously in the preset time.

5. The proximity magnetic induction switch control chip of claim 1, wherein the proximity magnetic induction switch control chip also includes a low-voltage locking module, the input terminal of the low-voltage locking module is connected with the voltage input terminal of the control chip, and the output terminal of the low-voltage locking module is connected with the input terminal of the control module;
wherein when a power source is connected between a voltage input terminal and a ground terminal of the control chip, a power source is connected between the output terminal and the ground terminal of the control chip or a load is connected between the voltage input terminal of the control chip and the ground terminal, the low-voltage locking module is in a locking state, and the control module controls the voltage regulator module to stop working.

6. A control method of a proximity type magnetic induction switch control chip, wherein the voltage output terminal of the proximity type magnetic induction switch control chip is connected with a voltage input terminal of the Hall device, the signal input terminal of the proximity type magnetic induction switch control chip is connected with the signal output terminal of the Hall device, wherein the control chip comprises a voltage regulator module, a control module, an output type detection module, a first controllable switch and a second controllable switch; wherein the control module is respectively connected with a control terminal of the voltage regulator module, an output terminal of the output type detection module, a control terminal of the first controllable switch and a control terminal of the second controllable switch. The input terminal of the first controllable switch, the first input terminal of the output type detection module and the voltage input terminal of the voltage regulator module are connected together and constitute the voltage input terminal of the proximity magnetic induction switch control chip. The output terminal of the first controllable switch, the output terminal of the second controllable switch and the second input terminal of the output type detection module are connected together and constitute the signal output terminal of the proximity magnetic induction switch control chip. The input terminal of the second controllable switch and the third input terminal of the output type detection module are connected to the ground and constitute the grounding terminal of the proximity magnetic induction switch control chip. The output terminal of the voltage regulator module is the voltage output terminal of the proximity type magnetic induction switch control chip, and the input terminal of the control module is the signal input terminal of the proximity type magnetic induction switch control chip;
wherein the control method includes the following steps:
the voltage regulator module outputs the input voltage to the Hall device for power supply after adjusting the input voltage;
when the output type detection module detects the load connected between the voltage input terminal and the signal output terminal of the proximity type magnetic induction switch control chip or the load connected between the signal output terminal of the control chip and the grounding terminal, it sends the detection result to the control module; and
the control module processes the induction signal sent by the Hall device and controls the first controllable switch or the second controllable switch to actuate the load according to the detection result.

7. The control method of claim 6, wherein the proximity type magnetic induction switch control chip also comprises a LED drive module, and the input terminal of the LED driving module is connected with the output terminal of the control module. The output terminal of the LED driving module is connected with the first LED lamp and the second LED lamp;
the control method also includes:
when the control module controls the first controllable switch to be turned on, the LED driving module is driven to make the first LED lamp work; and
when the control module controls the second controllable switch to be turned on, the LED driving module is driven to make the second LED work.

8. The control method of claim 7, wherein when the control module detects an output current anomaly, the LED drive module is driven so that the first LED lamp or the second LED lamp is in a flashing state, the first controllable switch or the second controllable switch is turned on again when the induction signal is detected and the protection working state is continuously in the present time.

9. The control method of claim 6, wherein the proximity type magnetic induction switch control chip also includes a low-voltage locking module and the input terminal of the low-voltage locking module is connected with the voltage input terminal of the control chip, the output terminal of the low-voltage locking module is connected with the input terminal of the control module;
wherein the control method also includes:
when a power source is connected between a voltage input terminal of the control chip and a grounding terminal, a power source is connected between the output terminal of the control chip and the grounding terminal, or a load is connected between the voltage input terminal of the control chip and the grounding terminal, the low-voltage locking module is in a locking state and the control module controls the voltage regulator module to stop working.

* * * * *